US012604696B2

(12) United States Patent
Takumi et al.

(10) Patent No.: US 12,604,696 B2
(45) Date of Patent: Apr. 14, 2026

(54) LIQUID PROCESSING METHOD, LIQUID PROCESSING APPARATUS, AND STORAGE MEDIUM

(71) Applicant: Tokyo Electron Limited, Tokyo (JP)

(72) Inventors: Takahiro Takumi, Kumamoto (JP); Takeshi Shimoaoki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/725,771

(22) PCT Filed: Dec. 26, 2022

(86) PCT No.: PCT/JP2022/048001
§ 371 (c)(1),
(2) Date: Jun. 30, 2024

(87) PCT Pub. No.: WO2023/132298
PCT Pub. Date: Jul. 13, 2023

(65) Prior Publication Data
US 2025/0105029 A1 Mar. 27, 2025

(30) Foreign Application Priority Data

Jan. 7, 2022 (JP) ................................. 2022-001955

(51) Int. Cl.
*H01L 21/027* (2006.01)
*H01L 21/67* (2006.01)
(52) U.S. Cl.
CPC .............................. *H01L 21/67023* (2013.01)

(58) Field of Classification Search
CPC ............. H01L 21/027; H01L 21/67253; H01L 21/67288
See application file for complete search history.

(56) References Cited

U.S. PATENT DOCUMENTS

2019/0383963 A1* 12/2019 Hayashi ............. G01N 15/1459

FOREIGN PATENT DOCUMENTS

| CN | 106583175 A | 4/2017 |
|---|---|---|
| JP | 2003203894 A | 7/2003 |

(Continued)

OTHER PUBLICATIONS

International Search Report issued on Feb. 7, 2023 for WO 2023/132298 A1 (4 pages).

*Primary Examiner* — Paul J Gray
(74) *Attorney, Agent, or Firm* — Venjuris, P.C.

(57) ABSTRACT

A liquid processing method includes: a substrate processing process for allowing a processing liquid to flow through a flow path connecting a reservoir and a processing liquid supply, and be discharged to a substrate from the processing liquid supply, thereby processing the substrate; a stay process for filling the flow path with a liquid and keeping the liquid stay in the flow path; a flow-through process for allowing the staying liquid to flow through the flow path; a signal acquisition process for irradiating the flow path with a light by a light irradiator and receiving the light from the flow path by the light receiver, to acquire a detection signal output from the light receiver according to a foreign substance in the liquid; and a response process for estimating an abnormal location in the flow path based on the detection signal, and presenting or executing a response operation.

15 Claims, 6 Drawing Sheets

(56)         References Cited

FOREIGN PATENT DOCUMENTS

| | | | |
|---|---|---|---|
| JP | 2021-168395 | A | 10/2021 |
| KR | 20160142778 | A | 12/2016 |
| KR | 20210143111 | A | 11/2021 |
| WO | 2016084924 | A1 | 6/2016 |

* cited by examiner

LIQUID PROCESSING METHOD, LIQUID PROCESSING APPARATUS, AND STORAGE MEDIUM

CROSS REFERENCE TO RELATED APPLICATIONS

This application is a national phase of PCT application No. PCT/JP2022/048001, filed on Dec. 26, 2022, which claims priority from Japanese patent application No. 2022-001955, filed on Jan. 7, 2022, all of which are incorporated herein by reference.

TECHNICAL FIELD

The present disclosure relates to a liquid processing method, a liquid processing apparatus, and a program.

BACKGROUND

In the processes of manufacturing semiconductor devices, a processing liquid is supplied to semiconductor wafers (hereinafter, referred to as "wafers") to perform, for example, a film formation and a cleaning. Patent Document 1 discloses a technique, which detects foreign substances in the processing liquid supplied to the wafers in an optical manner.

PRIOR ART DOCUMENT

Patent Document

Patent Document 1: Japanese Patent Laid-Open Publication No. 2021-168395

SUMMARY OF THE INVENTION

Problems to be Solved

The present disclosure provides a technology, in which during an operation of a liquid processing apparatus that supplies a processing liquid to a substrate, it is possible to prevent the increase in time when the liquid processing apparatus may not operate due to foreign substance in a flow path of the processing liquid.

Means to Solve the Problem

According to the present disclosure, a liquid processing method includes:

a substrate processing process for allowing a processing liquid to flow through a flow path connecting a reservoir storing the processing liquid and a processing liquid supply, and be discharged to a substrate from the processing liquid supply, thereby processing the substrate;

a stay process for filling the flow path with a liquid and keeping the liquid stay in the flow path;

a flow-through process for allowing the staying liquid to flow through the flow path;

a signal acquisition process for irradiating the flow path with a light by a light irradiator and receiving the light from the flow path by the light receiver, during the flow-through process, to acquire a detection signal output from the light receiver according to a foreign substance in the liquid; and a response process for estimating an abnormal location in the flow path based on the detection signal, and presenting or executing a response operation to respond to an abnormality.

Effect of the Invention

According to the present disclosure, during an operation of a liquid processing apparatus that supplies a processing liquid to a substrate, it is possible to prevent the increase in time when the liquid processing apparatus may not operate due to foreign substance in a flow path of the processing liquid.

DETAILED DESCRIPTION TO EXECUTE THE INVENTION

Figure 1:
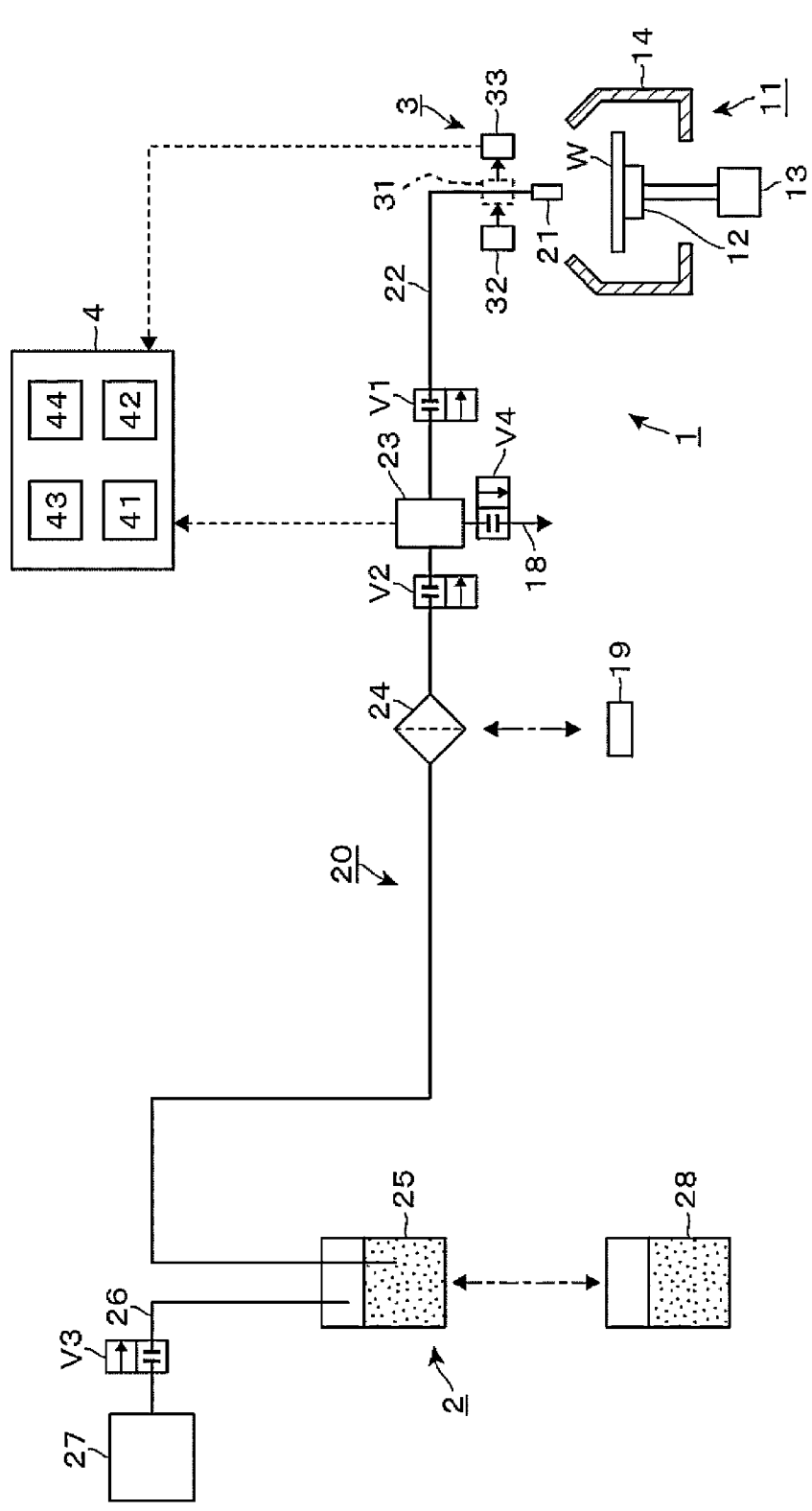
FIG. 1 is a configuration view of a resist coating apparatus according to an embodiment of a liquid processing apparatus of the present disclosure.

A resist coating apparatus 1, which is an embodiment of a liquid processing apparatus of the present disclosure, will be described with reference to FIG. 1. The resist coating apparatus 1 applies a resist as a processing liquid to a wafer W, which is a substrate, by a spin coating to form a resist film. The resist coating apparatus 1 includes a processing unit 11, a piping system 2, a foreign substance detection mechanism 3, and a control unit 4.

The processing unit 11 includes a spin chuck 12, a rotation mechanism 13, and a cup 14. A transfer mechanism (not illustrated) outside the resist coating apparatus 1 delivers the wafer W with respect to the spin chuck 12. The center of the back surface of the wafer W is adsorbed and held by the spin chuck 12, and the spin chuck 12 is rotated by the rotation mechanism 13. The cup 14 surrounds the side circumference of the wafer W held by the spin chuck 12, and receives the resist scattering from the wafer W.

Next, the configuration of the piping system 2 will be described. In order to avoid the complexity in description, FIG. 1 illustrates the piping system 2 in a simplified form, as compared to the actual apparatus configuration. The piping system 2 includes a nozzle 21. The nozzle 21 is movable between a processing position above the center of the wafer W held by the spin chuck 12 and a standby position outside the cup 14 by a movement mechanism (not illustrated), and discharges the resist downward.

When processing the wafer W, the nozzle 21 moves from the standby position to the processing position, and discharges the resist to the center of the wafer W. The wafer W, to which the resist has been discharged, is rotated by the rotation mechanism 13, so that the resist, which is a processing liquid, is applied to the entire surface of the wafer W, and a resist film is formed from the resist. That is, a substrate processing process is performed. A thinner may be discharged from the nozzle 21 as a liquid other than the resist when the wafer W is not processed, and details thereof will be described herein later.

The piping system 2 includes a pipe 22, valves V1 to V4, a pump 23, a filter 24, a resist storage unit 25, a pressurization pipe 26, an $N_2$ (nitrogen) gas supply source 27, and a discharge pipe 18, in addition to the nozzle 21. The downstream end of the pipe 22 is connected to the nozzle 21. The upstream side of the pipe 22 is connected to the resist storage unit 25 that stores the resist, via the valve V1, the pump 23, the valve V2, and the filter 24 in this order. The pipe 22 and each of the members provided in the middle of the pipe 22 make up a flow path that connects the resist storage unit 25, which is a processing liquid storage unit, and the nozzle 21, which is a processing liquid supply unit.

When the valve V1 is closed and the valve V2 is opened, the resist in the resist storage unit 25 flows in the pipe 22 toward the downstream side by a liquid absorption operation of the pump 23, and is stored in the pump 23. When the valve V1 is opened and the valve V2 is closed, the resist is supplied from the pump 23, which is a flow-through mechanism, to the downstream side of the piping system 2 by a discharge operation of the pump 23 (operation to pump the liquid out of the pump 23), and discharged from the nozzle 21.

The discharge amount per discharge operation of the pump 23 is set to a predetermined value. The control unit 4 to be described herein later is a computer, and is configured to calculate the discharge amount of a liquid (resist or thinner) discharged from the nozzle 21 by the operation of the pump 23 from a specific time point, based on the set value of the discharge amount per discharge operation and the number of discharge operation times. Thus, the pump 23 and the control unit 4 make up a discharge amount measurement mechanism.

The flow path, through which the resist flows from the tip of the nozzle 21 to the upstream end of the pipe 22, will be referred to as a flow path 20. The downstream side of the pressurization pipe 26 is connected to the resist storage unit 25, and the pressurization pipe 26 is opened in the gas phase inside the resist storage unit 25. The upstream end of the pressurization pipe 26 is connected to the $N_2$ gas supply source 27 via the valve V3. The supply and the cutoff of the $N_2$ gas to the resist storage unit 25 are controlled by the opening/closing of the valve V3. By the supply of the $N_2$ gas, the inside of the resist storage unit 25 is pressurized so that the resist is forcibly sent to the downstream side of the pipe 22. The forcible sending of the resist by the $N_2$ gas is performed when a cleaning operation to be described herein later is performed on the flow path 20, and the discharge operation of the pump 23 is performed when the resist is discharged to the wafer W as described above.

The resist storage unit 25 may be replaced with a thinner storage unit 28 that stores the thinner, instead of the resist. In order to clean the piping system 2 at the starting time of the apparatus to be described herein later, the pipe 22 and the pressurization pipe 26 are connected to the thinner storage unit 28. In that case, instead of the resist, the thinner is supplied from the thinner storage unit 28 to the pipe 22, and discharged from the nozzle 21. Further, at the starting time of the apparatus, the filter 24 is separated from the piping system 2 in order to improve the flowability of the liquid and enhance the cleaning performance. In that case, instead of the filter 24, a flow path forming member 19 having no filter function is attached, so that the liquid may flow through the piping system 2.

In addition, one end of the discharge pipe 18 is connected to the pump 23, and the other end of the discharge pipe 18 is opened in the air atmosphere. The valve V4 is provided in the middle of the discharge pipe 18. After the pump 23 performs the liquid absorption operation as described above, the valves V1 and V2 are closed, and the pump 23 operates in the state where the valve V4 is opened, so that bubbles accumulated in the pump 23 are removed through the discharge pipe 18. The valve V4 is closed during time excluding the time when the bubbles are discharged.

A light transmitting unit 31 is provided at the downstream side of the valve V1 of the pipe 22 in the vicinity of the nozzle 21. More specifically, a portion of the flow path from the valve V1 to the nozzle 21 is formed by the light transmitting unit 31, and the portion of the flow path 20 described above is configured with the light transmitting unit 31. The light transmitting unit 31 is formed of, for example, quartz to enable the detection of the optical foreign substance by the foreign substance detection mechanism 3.

Hereinafter, the foreign substance detection mechanism 3 will be described. The foreign substance detection mechanism 3 includes a light projecting unit 32 and a light receiving unit 33, and each of the light projecting unit 32 and the light receiving unit 33 is provided outside of the light transmitting unit 31. The light projecting unit 32 emits light toward the flow path formed by the light transmitting unit 31. The light receiving unit 33 is disposed to receive a side-scattering light generated in the flow path of the light transmitting unit 31, and outputs a detection signal to the control unit 4 in response to the received light.

For each wafer W, one discharge operation of the pump 23 is performed to execute the coating process described above. During the one discharge operation, that is, during the time period when the resist flows through the flow path of the light transmitting unit 31, the light emission from the light projecting unit 32 to the light transmitting unit 31 and the acquisition of the detection signal by the control unit 4 are performed. Accordingly, data (e.g., time series data) on a transition (behavior) of a signal level during the time period is acquired. The time-series data include information on the number and the particle diameter of particles, which are foreign substance in the liquid. That is, the foreign substance detection mechanism 3 is configured to output the detection signal according to the foreign substance in the liquid. The control unit 4 determines whether the processing on the wafer W is appropriately performed, based on the time-series data.

As will be described in detail later, the detection of particles is also performed by the particle detection mechanism 3 during time excluding the time when the wafer W is processed. In this case as well, the detection signal is acquired for a predetermined time period to form time-series data. In addition to the particles in the resist, particles in the thinner are also detected using the foreign substance detection mechanism 3. According to the foreign substance detection mechanism 3, particles having the particle diameter of, for example, 10 nm to 200 nm may be detected. During each step for detecting the number of particles in each work flow to be described herein later, the number of particles having the particle diameter within the predetermined range, which falls in the detectable range as described above, is detected. Here, the detected particles also include, for example, bubbles and resist components such as polymer that have an abnormal size.

Meanwhile, there is a case where an abnormality occurs at a specific location of the resist flow path of the piping system 2, and the particles described above are generated in a relatively large amount from the location (referred to as a contaminated location, for convenience). That is, some of the members that make up the flow path, such as the valve V1 and the pump 23 described above, may become contaminated. By performing the cleaning operation on the flow path, the flow path may be cleaned, thereby reducing the number of particles, and meanwhile, multiple types of cleaning operations exist. In order to quickly and reliably reduce the particles in the flow path, it is effective to perform a cleaning recipe including one of the multiple types of cleaning operations or a combination of the multiple types of cleaning operations according to the contaminated (abnormal) location.

In the resist coating apparatus 1, the foreign substance detection mechanism 3 is used to perform a test for estimating a member that is a contaminated location (referred to as a stay test), and present a cleaning recipe according to the result of the stay test to a user of the apparatus. Then, the presented cleaning recipe is executed according to an instruction from the user. The execution of the cleaning recipe is an operation to respond to abnormality.

The stay test, the presentation of the cleaning recipe, and the execution of the cleaning recipe may be performed at each of the starting time and the operating time of the resist coating apparatus 1. The starting time of the apparatus refers to the time period before the processing on the wafer W starts, and more specifically, the time period before the resist is caused to flow through the piping system 2. The operating time of the apparatus refers to the time period when wafers W are sequentially transferred to the resist coating apparatus 1.

Figure 2:
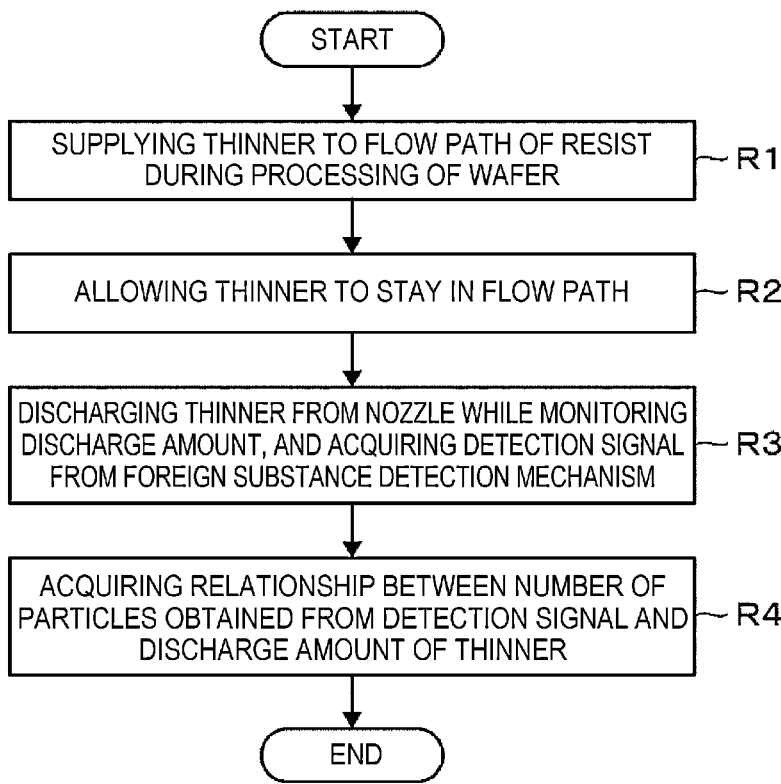
FIG. 2 is a flowchart of a stay test conducted at the starting time of the resist coating apparatus.

The stay test performed at the starting time of the apparatus will be described with reference to the flow in FIG. 2. For the convenience in description, it is assumed that, in the flow path 20 from the tip of the nozzle 21 to the upstream end of the pipe 22, the volume from the tip of the nozzle 21 to the valve V1 is 20 mL, the volume from the valve V1 to the pump 23 is 30 mL, and the volume from the pump 23 to the upstream end of the pipe 22 is 100 mL. Further, since the apparatus starts, the thinner storage unit 28 and the flow path forming member 19, instead of the resist storage unit 25 and the filter 24, are attached to the piping system 2.

In the stay test, the $N_2$ gas is supplied from the $N_2$ gas supply source 27 to the thinner storage unit 28, and the entire flow path 20 is filled with the thinner supplied from the thinner storage unit 28 by the opening/closing operation of each valve V and the operation of the pump 23 (step R1). After the filling, the operation of the pump 23 stops, and the supply of the $N_2$ gas from the $N_2$ gas supply source 27 stops simultaneously (e.g., the valve V3 is closed). As a result, the thinner does not flow in the flow path 20, and enters into the state of staying in the flow path 20 (step R2).

Further, the time point when the operation of the pump 23 stops and the valve V3 is closed to enter the state above is set as t1. After the time point t1, the foreign substance at the contaminated location is released as particles into the thinner filled and staying in the flow path 20. Since the thinner does not flow, the particles stay near the contaminated location. Accordingly, the number of particles at the local location of the flow path 20 increases. Steps R1 and R2 correspond to a stay process.

At a subsequent time point t2, the pump 23 performs the liquid absorption operation and the discharge operation to form the flow of the thinner from the thinner storage unit 28 to the nozzle 21, and the thinner staying in the flow path 20 is discharged from the nozzle 21. As a result, the particles released from the contaminated location into the flow path pass through the light transmitting unit 31, and are discharged from the nozzle 21. For example, when the thinner is discharged in the amount corresponding to the volume of the flow path 20, the operation of the pump 23 is stopped, and the discharge of the thinner from the nozzle 21 is ended. The time point when the discharge is ended is set as t3. During the time period from the time point t2 to the time point t3, the amount of thinner discharged from the nozzle 21 is monitored, and the acquisition of the detection signal from the foreign substance detection mechanism 3 is continued (step R3). Step R3 corresponds to a flow-through process, a discharge amount detection process, and a signal acquisition process. From the discharge amount of thinner and the detection signal, the relationship between the discharge amount of thinner and the number of particles having the particle diameter within the set range is acquired (step R4).

Figure 3:
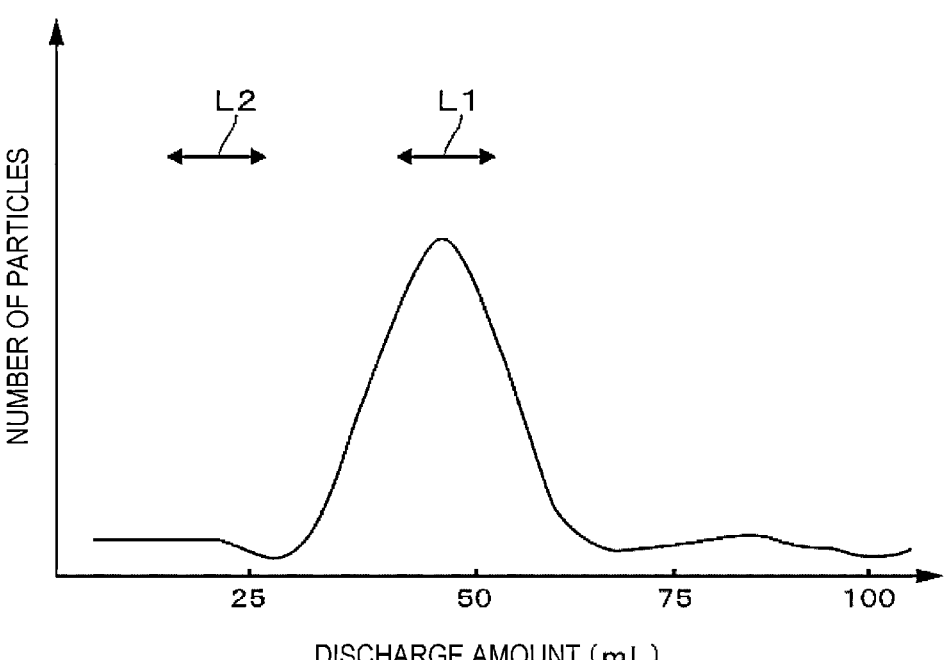
FIG. 3 is a graph view representing an example of a graph acquired by the stay test.

The relationship acquired in step R4 may be specifically represented as, for example, a graph illustrated in FIG. 3. In the graph of FIG. 3, the horizontal axis and the vertical axis represent the discharge amount of thinner and the number of particles, respectively. When the number of particles increases at the local location of the flow path 20 due to the release of particles from the contaminated location as described above, the waveform of the graph represents a peak at the discharge amount corresponding to that local location. The position of the nozzle 21 in the flow path 20 and the position of the light transmitting unit 31 where the detection of particles is performed are slightly deviated from each other. Thus, in the flow path 20, the location from the tip of the nozzle 21 toward the upstream side of the flow path 20 may be estimated as the contaminated location, which corresponds to the total amount of the volume (mL) from the tip of the nozzle 21 to the light transmitting unit 31 and the discharge volume (mL) at which the peak appears. Further, since the number of particles is determined by detecting the foreign substance based on the detection signal from the foreign substance detection mechanism 3 described above, the estimation of the contaminated location from the waveform of the graph corresponds to the estimation based on the discharge amount when the particles are detected.

When the graph of FIG. 3 is obtained, the peak of the waveform appears at a position where the discharge amount is slightly smaller than 50 mL, and thus, it may be estimated that the pump 23 positioned on the upstream side of the flow path 20 by the volume of 50 mL from the tip of the nozzle 21 is the contaminated location. In this way, since the contaminated location may be estimated from the relationship between the discharge amount of thinner and the number of particles, the presentation of the cleaning recipe is possible as described above. In FIG. 3, L1 and L2 are a first set range and a second set range for the discharge amount, respectively. The discharge amount in the first set range L1 is the same as or approximate to the volume from the tip of the nozzle 21 to the pump 23, and the discharge amount in the second set range L2 is the same as or approximate to the volume from the tip of the nozzle 21 to the valve V1. The presentation of the cleaning recipe is performed by determining whether the peak of the waveform in the graph above falls in the set ranges L1 and L2 for the discharge amount. Hereinafter, the graph obtained in the stay test as described above, which represents the relationship between the discharge amount of liquid from the nozzle 21 and the number of particles will be referred to as a graph for the discharge amount vs. the number of particles.

The stay test at the operating time of the apparatus is substantially the same as the stay test at the starting time of the apparatus, and the difference between both lies in that when performing the stay test during the processing of the wafer, the resist instead of the thinner is caused to stay in the flow path 20 because the resist storage unit 25 is attached to the piping system 2, and the resist is being supplied from the resist storage unit 25 to the flow path 20. Further, there is another difference in that the member making up the flow path 20 differs because the filter 24, instead of the flow path forming member 19, is provided in the piping system 2 during the processing of the wafer W as described above.

Meanwhile, in the stay test, the time point t1 to the time point t2 when the thinner or resist is caused to stay (referred to as the stay time) is set such that particles are sufficiently released into the flow path 20 to improve the accuracy of the test, and the time during which the processing of the wafer W stops is not excessive. From this view point, the stay time is preferably, for example, 0.5 hours to 12 hours, more preferably, for example, 0.5 hours to 9 hours. In the stay test at the operating time of the apparatus, the stay time is more preferably, for example, 2 hours or shorter, from the view-point of more reliably preventing the drying and solidification of the resist in the flow path 20.

In order to further describe the stay time, wafers W are transferred to the resist coating apparatus 1 and processed therein at regular intervals during the operation of the apparatus. When the wafers W are sequentially processed in this way, the liquid absorption operation and the multiple discharge operations of the pump 23 are repeated. Accordingly, the resist at the upstream end of the flow path 20 gradually moves to the nozzle 21 and is discharged onto the wafers W. When a time X indicates the time during which the resist moves from the upstream end of the flow path 20 and is discharged from the nozzle 21, the stay time is set to be longer than the time X, for the purpose of sufficiently releasing the particles into the flow path 20. Further, the time X is also the time from an arbitrary timing to a timing when the amount of one discharge by the pump 23× the number of discharge times becomes larger than the volume of the flow path 20.

Next, descriptions will be made on examples of five different types of cleaning operations that make up a cleaning recipe. The five types of cleaning operations will be referred to as a line cleaning, gas-liquid substitution, pressurized purge, pump bubble removal, and short dummy. For these cleaning operations, the thinner of the resist storage unit 25 or the resist of the thinner storage unit 28, which is connected to the piping system 2, is used as a cleaning liquid, and thus, the cleaning liquids used at the starting time and the operating time of the apparatus are different from each other. Here, descriptions will be made assuming that the cleaning at the starting time of the apparatus is performed, and the thinner is the cleaning liquid.

The five types of cleaning operations are common in that the cleaning liquid is caused to flow from the upstream side toward the downstream side in the flow path 20. In some of the five types of cleaning operations, the cleaning liquid is discharged from the nozzle 21. In the line cleaning, the N$_2$ gas is supplied from the gas supply source 27 for a preset time period in the state where the valves V1 to V3 are opened, thereby forcibly sending the thinner of the thinner storage unit 28 to the nozzle 21 and discharging the thinner from the nozzle 21, so that the cleaning of the flow path 20 is performed.

In the gas-liquid substitution, the same operation as that of the line cleaning is performed first, so that the thinner of the thinner storage unit 28 is forcibly sent to and discharged from the nozzle 21. Even when the thinner of the thinner storage unit 28 is exhausted, the supply of the N$_2$ gas to the thinner storage unit 28 is continued, so that the thinner is removed from the flow path 20, the N$_2$ gas is discharged from the nozzle 21 to purge the flow path 20, and the thinner in the flow path 20 is substituted with the N$_2$ gas. Then, an operator replaces the thinner storage unit 28 with a thinner storage unit 28 filled with the thinner. Then, the flow path 20 is refilled with the thinner, by the supply of the N$_2$ gas from the gas supply source 27. The line cleaning, the substitution with the N$_2$ gas in the flow path 20, the replacement of the thinner storage unit 28, the refill of the thinner in the flow path 20, and the line cleaning are repeated a predetermined number of times.

In the pressurized purge, the pump 23 and the valves V1 to V3 operate in the same manner as that when the resist is discharged to the wafer W, so that the thinner is discharged from the nozzle 21. However, the discharge pressure of the pump 23 when the pressurized purge is performed is set to be higher than the discharge pressure when the processing of the wafer W is performed. In the pump bubble removal, the pump 23 operates in the state where the valves V4 and V2 are opened and the valves V1 and V3 are closed, so that the bubble accumulated in the pump is removed by being pushed out into the discharge pipe 18 due to the cleaning liquid supplied from the upstream side of the pump 23. In the short dummy, after the liquid absorption by the pump 23, the discharge operation of the pump 23 and the opening/closing of the valve V1 are repeated, so that the thinner is discharged from the nozzle 21. The interval of the thinner discharge from the nozzle 21 is shorter than the interval of the resist discharge when the wafers W are sequentially processed during the operation of the apparatus.

Of the cleaning operations described above, the line cleaning and the gas-liquid substitution may effectively clean the entire flow path 20, and especially, the gas-liquid substitution may more effectively clean the entire flow path 20 at the starting time of the apparatus. The pressurized purge may effectively clean the downstream region of the pump 23 in the flow path 20. The pump bubble removal is an effective cleaning operation when the bubbles accumulated in the pump 23 become particles. The short dummy is an effective cleaning method when the pump 23 and/or the valve V1 are contaminated locations. Further, during the operation of the apparatus, the resist storage unit 25, instead of the thinner storage unit 28, is attached to the piping system 2, and thus, the resist is used instead of the thinner as the cleaning liquid. Except for this difference, the cleaning operations at the operating time and the starting time of the apparatus may be identically performed.

The foreign substance detection mechanism 3 is also used to determine whether the cleaning of the flow path 20 is appropriately performed by the cleaning recipe including the cleaning operations described above. During the flow of the resist or thinner through the light transmitting unit 31 in the cleaning operation, the control unit 4 acquires a detection signal from the foreign substance detection mechanism 3, and determines whether the flow path 20 has been cleaned, based on the number of particles obtained from the detection signal.

The control unit 4 will be described with reference to FIG. 1. As described above, the control unit 4 is a computer, and includes a program 41, a notification unit 42, an operation unit 43, and a memory 44. The program 41 sends a control signal to each component of the resist coating apparatus 1, to control each operation such as the opening/closing of each valve V, the operation of the pump 23, or the light emission by the foreign substance detection mechanism 3, so that the cleaning operation and the processing on the wafer W are performed as described above. Further, the program 41 is designed to progress the stay flow described in FIG. 2 and the work flow illustrated in FIGS. 4 and 6 to be described herein below. Thus, the program 41 is configured to also perform acquiring the detection signal from the foreign substance detection mechanism 3, detecting the discharge amount of liquid from the nozzle 21, generating the graph for the discharge amount vs. the number of particles from the detection signal and the discharge amount, identifying the peak of the graph, comparing the peak with the set range of the discharge amount, and presenting the cleaning recipe based on the comparison. The program 41 is installed after being stored in a storage medium such as a compact disk, a hard disk, a memory card, or a DVD.

The notification unit 42 is configured with, for example, a display or a speaker, and presents the cleaning recipe to the user of the apparatus by display on a screen or voice. As described herein below, in a case where the flow path 20 may not be cleaned even though the cleaning recipe is repeated (in a case where the start work is abnormally terminated or the apparatus may not be restored), the circumstance is notified to the user by the notification unit 42. The operation unit 43 is configured with, for example, buttons and switches, and the user may perform a predetermined operation in the operation unit 43 to execute the presented cleaning recipe. The memory 44 stores, for example, the capacity from the tip of the nozzle 21 to each member in the flow path 20 as described above, parameters in each cleaning operation (e.g., execution time and the number of times for the discharge operation of the pump 23), the order in which each cleaning operation making up the cleaning recipe is performed, and the first and second set ranges L1 and L2 for the discharge amount. That is, the memory 44 stores information necessary to perform the stay test or present and execute the cleaning recipe.

Figure 4:
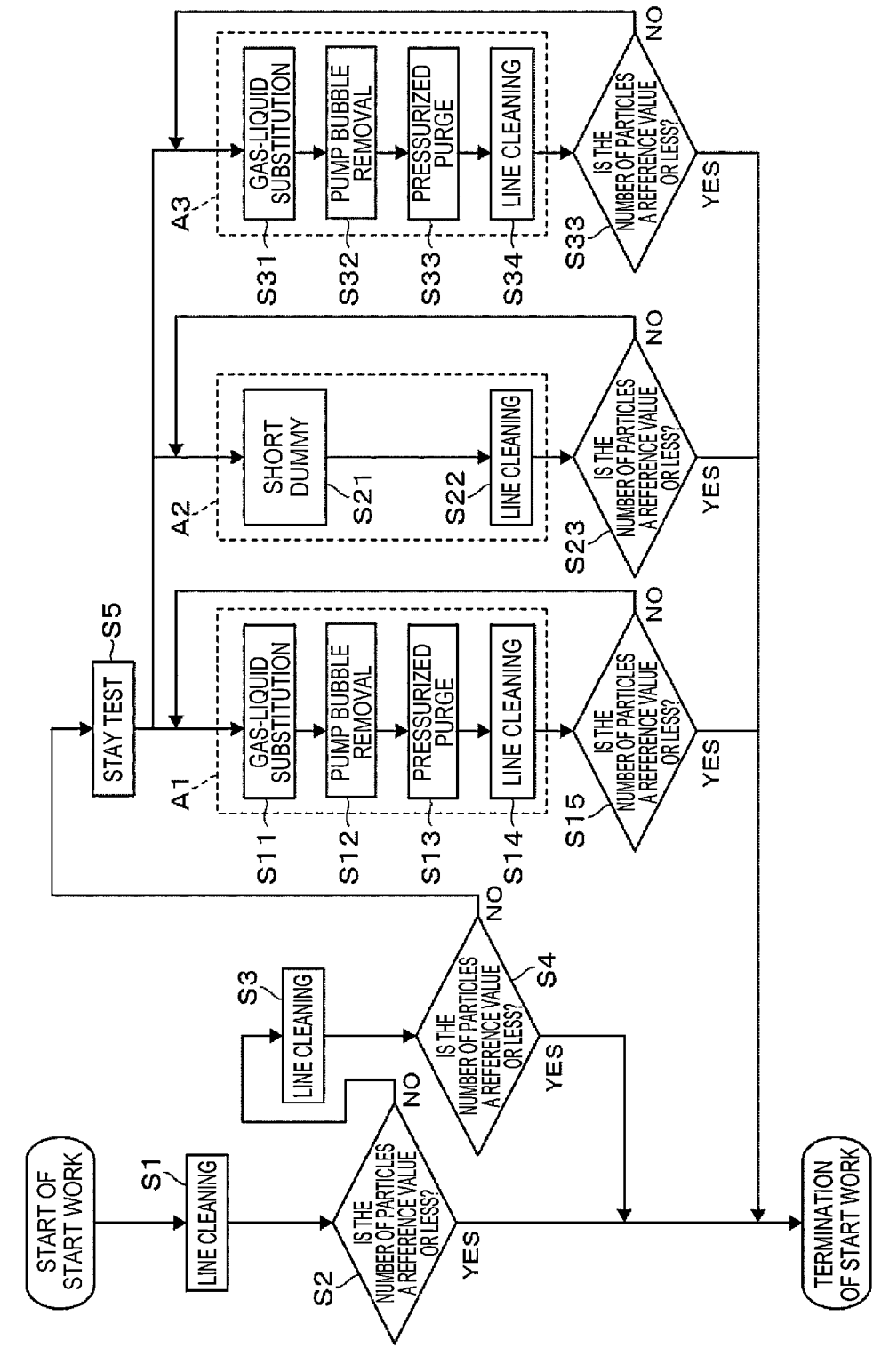
FIG. 4 is a flowchart of works including the stay test in a start work of the resist coating apparatus.

Next, referring to FIG. 4, an example of the flow of the work for cleaning the flow path 20 at the starting time of the apparatus (hereinafter, referred to the start work) will be described. First, when the thinner supplied from the thinner storage unit 28 is supplied to the flow path 20 by the supply of the N₂ gas from the N₂ gas supply source 27 or the operation of the pump 23, the line cleaning is performed (step S1). For example, during an inspection time period of a predetermined length immediately before the termination of the line cleaning, the number of particles is detected based on the detection signal acquired from the foreign substance detection mechanism 3, and it is determined whether the number of particles is equal to or less than a reference value (step S2).

When it is determined in step S2 that the number of particles is equal to or less than the reference value, the start work is determined to have been normally terminated. When it is determined in step S2 or another step S to be described herein below that the start work has been normally terminated, the thinner storage unit 28 and the flow path forming member 19 are replaced with the resist storage unit 25 and the filter 24, respectively, and the resist is caused to flow from the resist storage unit 25 to the tip of the nozzle 21 by the operation of the pump 23, so that the processing of the wafer W is performed.

When it is determined in step S2 that the number of particles is not equal to or less than the reference value, the line cleaning is performed again (step S3). Then, as in step S2, the number of particles is detected based on the detection signal during the predetermined inspection time period, and it is determined whether the number of particles is equal to or less than the reference value (step S4). When it is determined in step S4 that the number of particles is equal to or less than the reference value, the start work is determined to have been normally terminated. When it is determined in step S4 that the number of particles is not equal to or less than the reference value, the stay test described above is performed (step S5), and the peak of the waveform in the graph for the discharge amount vs. the number of particles described in FIG. 3 and the discharge amount of thinner corresponding to the peak are identified.

For the convenience in description hereinafter, it is assumed that only one peak or no clear peak exists in the waveform of the graph, as a result of the stay test. When the discharge amount corresponding to the peak falls in the first set range L1, a cleaning recipe A1 is presented, which is set to achieve a high cleaning performance for the pump 23. When the discharge amount corresponding to the peak falls in the second set range L2, a cleaning recipe A2 is presented, which is set to achieve a high cleaning performance for the valve V1. When the discharge amount corresponding to the peak may not be identified due to the absence of a clear peak, or when the peak appears in a range outside the first set range L1 and the second set range L2, a cleaning recipe A3 for cleaning the entire flow path 20 is presented. Meanwhile, as described in FIG. 3, since the peak of the graph corresponds to the contaminated location, identifying the peak of the waveform corresponds to estimating the contaminated location.

After any one of the cleaning recipes A1 to A3 is presented as described above, when the user of the apparatus makes an instruction to start the cleaning recipe, the presented cleaning recipe is executed. When the cleaning recipe A1 is executed, the gas-liquid substitution (step S11), the pump bubble removal (step S12), the pressurized purge (step S13), and the line cleaning (step S14) are performed in this order. For the work requiring a work by an operator, such as the replacement of the resist storage unit 25 in the gas-liquid substitution of step S11, the work described above is performed, and each step progresses sequentially. This identically applies to other cleaning recipes to be described herein below.

The number of particles is detected based on the detection signal from the foreign substance detection mechanism 3, which is acquired for the inspection time period described above during the line cleaning in step S14. Then, it is determined whether the number of particles is equal to or less than the reference value (step S15). When it is determined in step S15 that the number of particles is equal to or less than the reference value in step S15, the start work is determined to have been normally terminated. When it is determined in step S15 that the number of particles is not equal to or less than the reference value, the cleaning recipe A1 (steps S11 to S14) and the corresponding determination on the number of particles (step S15) are performed again.

In this way, the cleaning recipe A1 and the determination in step S15 are repeated, and for example, when it is determined in step S15 after the cleaning recipe A1 is repeated "n" times ("n" is an integer) that the number of particles is not equal to or less than the reference value, the repetition of the cleaning recipe A1 and step S15 is stopped, and the start work is determined to have been abnormally terminated. Then, the operator takes a response, for example, the replacement of the pump 23.

When the cleaning recipe A2 is executed, the short dummy (step S21) and the line cleaning (step S22) are performed in this order. Then, during the inspection time period immediately before the termination of the line cleaning in step S22, it is determined whether the number of particles is equal to or less than the reference value (step S23). When it is determined in step S23 that the number of particles is equal to or less than the reference value in step S23, the start work is determined to have been normally terminated, and when it is determined that the number of particles is not equal to or less than the reference value, the cleaning recipe A2 (steps S21 and S22) and the corresponding determination (step S23) are performed again. The cleaning recipe A2 and the determination in step S23 are repeated, and when it is still determined in step S23 after the cleaning recipe A2 is repeated "n" times that the number of particles is not equal to or less than the reference value, the repetition of the cleaning recipe A2 and step S23 is stopped, and the start work is determined to have been abnormally terminated. Then, the operator takes a response, for example, the replacement of the valve V1.

When the cleaning recipe A3 is executed, the gas-liquid substitution (step S31), the pump bubble removal (step S32), the pressurized purge (step S33), and the line cleaning (step S34) are performed in this order. Then, during the inspection time period immediately before the termination of the line cleaning in step S34, it is determined whether the number of particles is equal to or less than the reference value (step S35). In this way, in the cleaning recipe A3 (steps S31 to S34), the same type of cleaning operation as that of the cleaning recipe A1 is performed in the same order. As in the case where the cleaning recipe A1 is executed, it is determined whether to repeat the cleaning recipe A3 and the determination described above, according to the determination in step S35, and when it is determined in step S35 that the number of particles is equal to or less than the reference value even though the repetition is performed "n" times, the start work is determined to have been abnormally terminated. When the start work has been abnormally terminated, the operator takes a response such as performing a test or replacement for each member of the piping system 2. Further, identifying the peak of the graph and executing any one of the cleaning recipes A1 to A3 correspond to a response process performed based on the detection signal.

Figure 5:
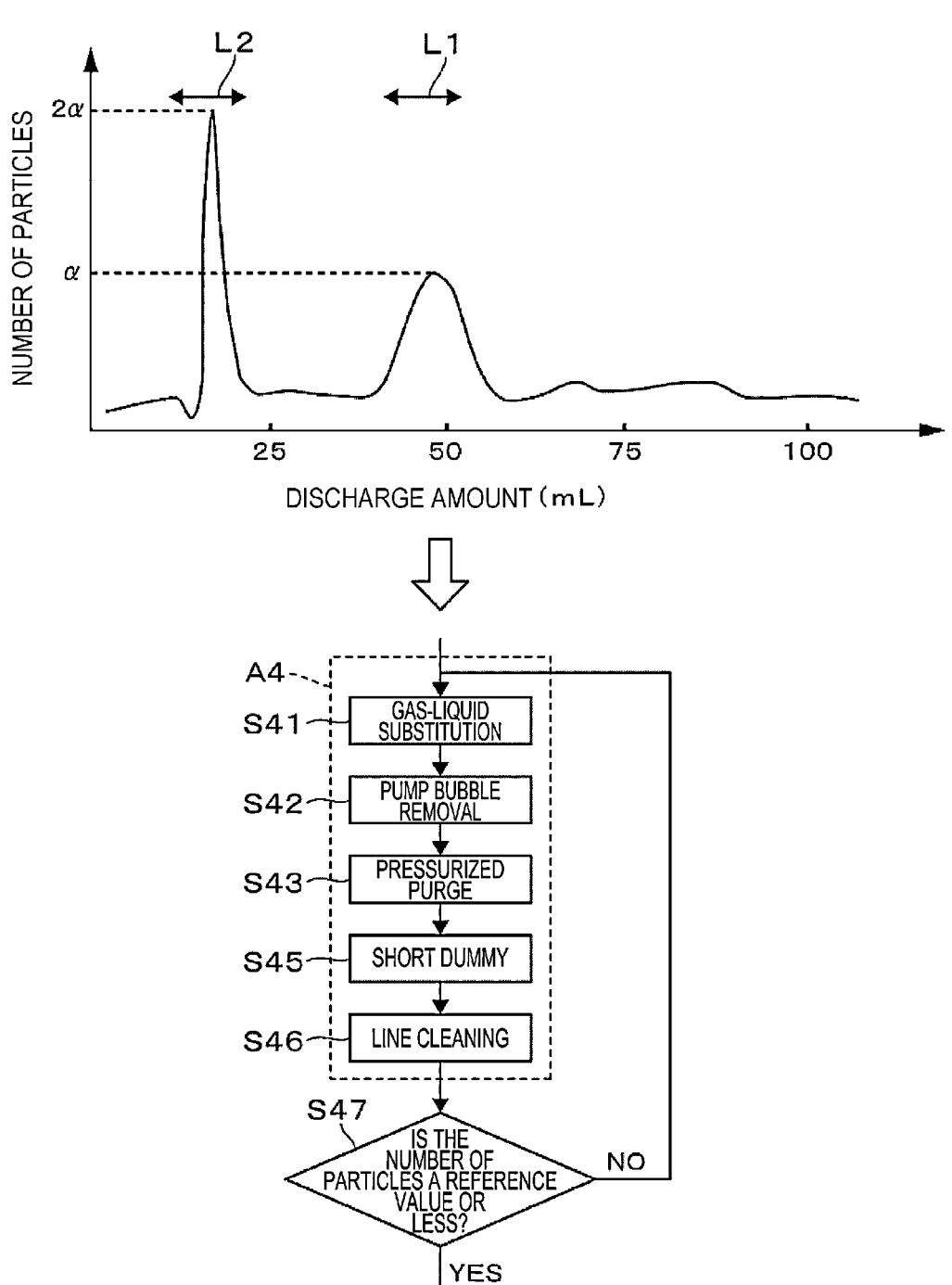
FIG. 5 is a graph representing an example of a graph acquired by the resist coating apparatus.

Meanwhile, as a result of the stay test, multiple peaks may appear in the waveform of the graph for the discharge amount vs. the number of particles. In this case, a cleaning recipe obtained by combining cleaning recipes corresponding to the peaks, respectively, is presented. FIG. 5 represents a specific example of a case where peaks appear in the first set range L1 and the second set range L2, respectively. A cleaning recipe is presented, which includes the cleaning operations included in the cleaning recipe A1 corresponding to the first set range L1 (gas-liquid substitution, pump bubble removal, pressurized purge, and line cleaning) and the cleaning recipe A2 corresponding to the second set range L2 (short dummy and line cleaning). The order of the cleaning operations during the execution of the cleaning recipe is determined by, for example, a predetermined algorithm.

FIG. 5 represents a cleaning recipe A4, which is an example of the cleaning recipe presented as a combination of the cleaning recipes A1 and A2. The cleaning recipe A4 includes the gas-liquid substitution (step S41), the pump bubble removal (step S42), the pressurized purge (step S43), the short dummy (step S44), and the line cleaning (step S45), and these cleaning operations are performed in sequence. As in the cleaning recipes A1 to A3, the determination on the number of particles is performed during the performance of the line cleaning (step S46). According to the result of the determination, it is determined whether to repeat the cleaning recipe A4 (steps S41 to S45) and the determination described above (step S46) or whether to determine that the start work has been normally terminated, and when it is determined in step S46 that the number of particles is not equal to or less than the reference value even though the cleaning recipe A4 is repeated "n" times, the start work is determined to have been abnormally terminated.

In combining the cleaning recipes as described above, parameters that contribute to the cleaning performance of a specific cleaning operation may be changed before and after the combination based on the height of each peak in the graph, for the purpose of efficiently cleaning each contaminated location and avoiding an excessive cleaning. As an example, the parameters of the cleaning operation specific to the cleaning recipe A1 corresponding to the first set range L1 are changed to the height of the peak in the first set range L1/the sum of the heights of the first and second peaks in the cleaning recipe A4. The parameters of the cleaning operation specific to the cleaning recipe A2 corresponding to the second set range L2 are also changed in the same way.

In order to more specifically describe the example above, it is assumed that the height of the peak in the first set range L1: the height of the peak in the second set range=1:2, as illustrated in FIG. 5. Of the cleaning operations included in the cleaning recipes A1 and A2, the pressurized purge, which is the cleaning operation specific to the cleaning recipe A1, is set such that the discharge operation of the pump 23 is performed "D" times in step S13 of the cleaning recipe A1. In this case, for example, in the pressurized purge of step S43 of the cleaning recipe A4, the discharge operation is performed, for example, "D" times×1/(1+2). Similarly, of the cleaning recipes A1 and A2, the short dummy, which is the cleaning operation specific to the cleaning recipe A2, is set such that the discharge operation of the pump 23 and the opening/closing operation of the valve V1 are performed "E" times in the cleaning recipe A2. In this case, for example, in the cleaning recipe A4, the discharge operation of the pump 23 and the opening/closing operation of the valve V1 are performed "E" times×2/(1+2).

In the combination, the parameters of the cleaning operations specific to the cleaning recipes A1 and A2 are changed, but a parameter of a cleaning operation to be changed may be set arbitrarily. As an example of the parameter, for the gas-liquid substitution, the number of substitution times may be changed; for the line cleaning, the time for causing the thinner to flow through the flow path 20 may be changed; or for the pump bubble removal, the number of times of the discharge operation by the pump 23 may be changed.

Figure 6:
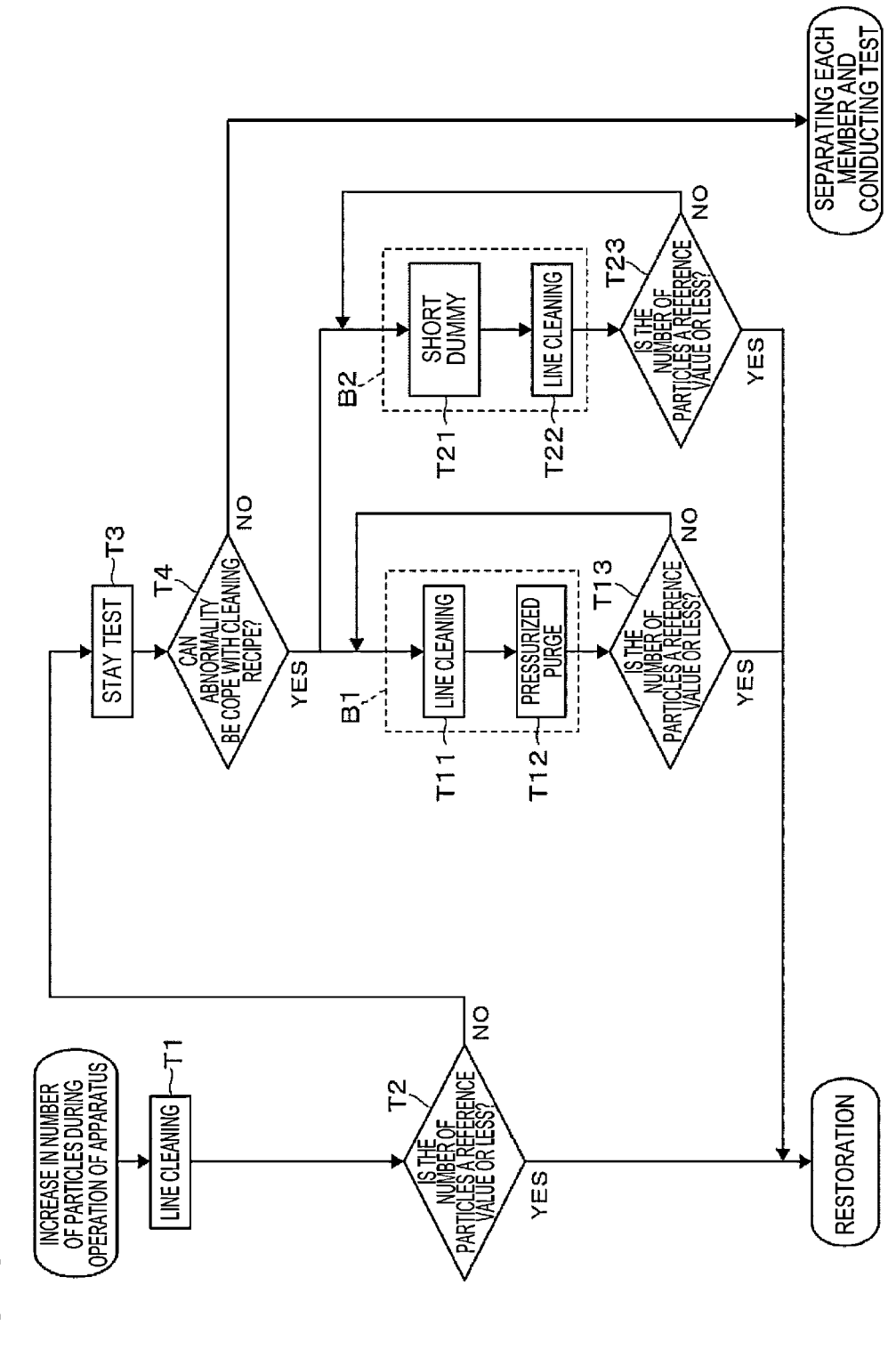
FIG. 6 is a flowchart of works including the stay test in an operation of the resist coating apparatus.

Next, the operation flow for cleaning the flow path 20 at the operating time of the apparatus will be described with reference to FIG. 6, focusing on the differences from the flow at the starting time of the apparatus. The resist is discharged from the nozzle 21 to form a resist film on the wafers W, which are sequentially transferred to the resist coating apparatus 1. During the discharge of the resist, the detection signal output from the foreign substance detection mechanism 3 is acquired, and the number of particles is detected. When it is determined that the number of particles is not equal to or less than the reference value, the carry-in of a new wafer W into the resist coating apparatus 1 is temporarily stopped.

After the carry-in is stopped, the line cleaning is performed (step T1). The number of particles is detected based on the detection signal acquired during the inspection time period immediately before the termination of the line cleaning, and it is determined whether the number of particles is equal to or less than the reference value (step T2). When it is determined in step T2 that the number of particles is equal to or less than the reference value, the apparatus is determined to have been successfully restored. When the restoration is successfully performed in step T2 or another subsequent step T to be described herein below, the transfer of wafers W to the resist coating apparatus 1 and the processing of the wafers W are restarted.

When it is determined in step T2 that the number of particles is not equal to or less than the reference value, the stay test is performed, and the graph for the discharge amount from the nozzle 21 vs. the number of particles is acquired (step T3). Then, the peak of the waveform and the discharge amount corresponding to the peak are identified, and a cleaning recipe is presented according to the identified peak.

Here, for the convenience in description, it is also assumed that only one peak or no clear peak exists in the waveform of the graph. When the discharge amount at which the peak appears falls in the first set range L1, a cleaning recipe B1 with a high cleaning performance for the pump 23 is presented. When the discharge amount at which the peak appears falls in the second set range L2, the cleaning recipe A2 with a high cleaning performance for the valve V1 is presented. When the discharge amount corresponding to the peak may not be identified due to the absence of a clear peak, or when the peak appears in a range outside the first set range L1 and the second set range L2, it is considered that the apparatus may not be automatically restored, and thus, no cleaning recipe is presented. That is, a determination is performed as to whether a cleaning recipe may respond to the abnormality (step T4). When no cleaning recipe is presented, for example, the operator separates each member in the apparatus, and conducts a test for identifying a cause.

After any one of the cleaning recipes B1 and B2 is presented, when the user makes an instruction to start the cleaning recipe, the presented cleaning recipe is executed. When the cleaning recipe B1 is executed, the line cleaning (step T11) and the pressurized purge (step T12) are performed in this order. In the pressurized purge of step T12, the discharge operation of the pump 23 is performed the set number of times, and for example, the number of particles is detected from the detection signal acquired during each of the predetermined number of discharge operations prior to the last discharge operation. Then, it is determined whether the number of particles is equal to or less than the reference value (step T13).

When it is determined in step T13 that the number of particles is equal to or less than the reference value, the apparatus is determined to have been successfully restored. When it is determined in step T13 that the number of particles is not equal to or less than the reference value, the cleaning recipe B1 (steps T11 and T12) and the corresponding determination (step T13) are performed again. In this way, the cleaning recipe B1 and the determination in step T13 are repeated, and when it is still determined in step T13 after the cleaning recipe B1 is repeated "m" times ("m" is an integer) that the number of particles is not equal to or less than the reference value, the repetition of the cleaning recipe B1 and the determination in step T13 is stopped, it is considered that the apparatus may not be automatically restored, and thus, a predetermined test is conducted by the operator.

When the cleaning recipe B2 is executed, the short dummy (step T21) and the line cleaning (step T22) are performed in this order. During the line cleaning in step T22, the detection signal is acquired as in the line cleaning in step T2, and the number of particles is detected from the detection signal during the inspection time period immediately before the termination of the line cleaning. Then, it is determined whether the number of particles is equal to or less than the reference value (step T23). When it is determined in step T23 that the number of particles is equal to or less than the reference value, it is considered that the apparatus has been successfully restored. When it is determined in step T23 that the number of particles is not equal to or less than the reference value, the cleaning recipe B2 (steps T21 and T22) and the corresponding determination (step T23) are performed again. In this way, the cleaning recipe B2 and the determination in step T23 are repeated, and when it is still determined in step T23 after the cleaning recipe B2 is repeated "m" times ("m" is an integer) that the number of particles is not equal to or less than the reference value, the repetition of the cleaning recipe B2 and the determination in step T23 is stopped, it is considered that the apparatus may not be automatically restored, and thus, a predetermined test is performed by the operator.

For the purpose of quickly restoring the apparatus and improving the productivity of the apparatus, the cleaning recipes B1 and B2, which present the pump 23 and the valve V1 as contaminated locations, respectively, include fewer and simpler cleaning operations than those of the cleaning recipes A1 and A2, which identically present the pump 23 and the valve V1 as contaminated locations, respectively, at the starting time of the apparatus. For the same purpose, in a case where the peak may not be identified or appears in a range other than the first and second set ranges L1 and L2, no cleaning recipe is presented, and it is considered that the automatic restoration is not possible. Further, while the cleaning recipes A1 to A3 and B1 to B3 may be repeated, the relationship between "n" times, which is the number of times for repeating the cleaning recipes A1 to A3, and "m" times, which is the number of times for repeating the cleaning recipes B1 to B2, in each flow described above is, for example, n>m, for the purpose described above.

Further, the filter 24 may become a contaminated location during the operation of the apparatus. Thus, a third set range L3 for the discharge amount corresponding to the position of the filter 24 and the cleaning recipe B3 with a high cleaning performance for the filter 24 may be set, and when the peak of the graph in the stay test appears in the third set range L3, the cleaning recipe B3 may be presented and executed. Further, when multiple peaks appear in the stay test, the cleaning recipes during the processing of the wafers are also combined, similarly to the cleaning recipes at the starting time of the apparatus.

According to the resist coating apparatus 1 configured as described above, a contaminated location is estimated at each of the starting time and the operating time of the apparatus, and a cleaning recipe corresponding to the contaminated location is presented. Thus, the cleaning of the contaminated location may be efficiently performed, so that the wasteful use of the thinner or the resist, which is the cleaning liquid, may be suppressed, and it is possible to prevent the state of the apparatus in which the wafers W may not be used for a long period of time. As a result, the productivity of semiconductor products may be improved. Further, it is possible to reduce the frequency in which the operator separates each member from the piping system 2 to identify a contaminated location and individually verify whether each member is a contaminated location, which reduces the workload of the operator.

It may be assumed that, without using the foreign substance detection mechanism 3, the detection of particles is performed by supplying a predetermined amount of cleaning liquid to the flow path, then discharging the cleaning liquid from the nozzle 21 to the wafer W on the spin chuck 12, and transferring the wafer W to a detection device outside the resist coating apparatus 1. In this case, a labor is required to transfer the wafer W to the outside of the resist coating apparatus 1. Further, when the detection of particles described above is performed, the wafer W is used without being processed. Therefore, the resist coating apparatus 1 also achieves effects in avoiding the labor for carrying out the wafer W and preventing the wafer W from being subjected to the processing that does not contribute to the production of semiconductor devices.

Meanwhile, the configuration of each cleaning recipe described above is an example, and the types or the order of the cleaning operations included in the recipe may be appropriately changed. Further, while each cleaning recipe is configured with a plurality of cleaning operations, each cleaning recipe may perform only one cleaning operation. Further, while the selection and the combination of the cleaning recipes are performed according to the stay test, the control unit 4 may be configured such that a cleaning recipe is automatically executed, regardless of an instruction from the user. Thus, the apparatus may be configured such that no cleaning recipe is presented to the user.

While the valve V1, the pump 23, and the filter 24 have been described as examples of the members that may become contaminated locations among the members making up the flow path 20, cleaning recipes may be set assuming that other members may become contaminated locations, and the cleaning recipes may be presented and executed according to the result of the stay test. Although not described herein, for example, a tank for temporarily storing the resist is provided between the filter 24 and the resist storage unit 25. The tank may be estimated as a contaminated location, and a cleaning recipe with a high cleaning performing for the tank may be prepared.

As for the graph for the discharge amount vs. the number of particles, which is acquired from the stay test, the control unit 4 may notify the graph to the user by, for example, displaying the graph on the display making up the notification unit 42. The user who sees the graph may replace the member corresponding to the peak position of the waveform. That is, the apparatus may be configured such that no cleaning recipe is executed. In this case, the user, instead of the control unit 4, estimates the contaminated location. Therefore, the subject that estimates the contaminated location is not limited to the control unit 4.

Next, descriptions will be made on a modification of the embodiment described above. In the embodiment described above, with respect to the line cleaning in the cleaning recipe A1 that is performed once or repeatedly, the time from the start to the termination of the line cleaning (referred to as the line cleaning time) is a preset fixed time. In the present modification, the control unit 4 determines the line cleaning time for the last of the cleaning recipe A1 that is performed once or repeatedly, according to the result of the stay test. In order to perform the determination, the control unit 4 is subjected to a machine leaning.

The machine learning above will be described. As described in the embodiment above, it is assumed that the flow at the starting time of the apparatus illustrated in FIG. 4 progresses, and the graph for the discharge amount vs. the number of particles, which is acquired as a result of the stay test in step S4, presents the cleaning recipe A1. The control unit 4 stores the graph for the discharge amount vs. the number of particles in the memory 44. Then, the execution of the cleaning recipe A1 is instructed, and steps S11 to S15 described above are performed. When performing the line cleaning in step S14, the detection signal may be continuously acquired from the foreign substance detection mechanism 3 during the line cleaning time (i.e., from the start to the termination of the line cleaning). The line cleaning time is the fixed time as described above. As in the example described above, the determination in step S15 is performed based on the detection signal acquired during the inspection time period immediately before the termination of the line cleaning. That is, among the detection signals acquired during the line cleaning time, detection signals acquired for a partial time period are for the determination.

It is assumed that the cleaning recipe A1 and the determination in step S15 are performed, and the start work has been normally terminated. As described in the flow of FIG. 4, the cleaning recipe A1 is executed once or multiple times until the termination of the start work. The detection signals continuously acquired during the line cleaning time of the last cleaning recipe A1 and the number of repetition times of the cleaning recipe A1 are stored in the memory 44 in association with the graph for the discharge amount vs. the number of particles, which is acquired immediately before the execution of the cleaning recipe A1. From the stored detection signals, the control unit 4 identifies a convergence time point, at which the number of particles no longer exceeds the reference value. That is, the number of particles does not exceed the reference value during the time period from the convergence time point to the termination of the line cleaning. Accordingly, identifying the convergence time point indicates detecting the minimum line cleaning time required to suppress the number of particles from exceeding the reference value, for the last line cleaning among the line cleanings that have been performed once or multiple times. In this way, the machine learning is performed each time the cleaning recipe A1 is presented and executed by the stay test.

Then, the result of the learning is output. Specifically, when the stay test is performed to obtain the graph for the discharge amount vs. the number of particles, which presents the cleaning recipe A1, the graph with the highest similarity (likeness) of the waveform is identified from the graphs stored in the memory 44. Then, for example, the cleaning recipe A1 is repeated as many times as the number of repetition times stored in association with the identified graph. For the last line cleaning among the line cleanings performed once or multiple times, the line cleaning is determined to be performed until the convergence time point corresponding to the graph. That is, the line cleaning time for the line cleanings other than the last line cleaning is the preset time as in the learning stage, but the time point for terminating the last line cleaning is advanced. Along with advancing the termination time point, the inspection time period for performing the determination in step S15 is also advanced in the last line cleaning. Then, when it is determined in step S15 that the number of particles is not equal to or less than the reference value, it is considered that the particles may not be reduced due to an unforeseen factor, and thus, the start work has been abnormally terminated.

By using the learning result as described above, it is possible to avoid that the line cleaning is unnecessarily performed, and thus, the thinner and the time are unnecessarily used even when the flow path 20 may not be sufficiently cleaned due to an unforeseen factor. Further, as the output, the present disclosure is not limited to identically applying the result of the convergence time point acquired in the past and executing the cleaning recipe A1, but the similarity between the graph obtained in the output stage after the learning stage and the graph obtained in the learning stage may be calculated by a predetermined algorithm, and the convergence time point may be changed according to the similarity. As in the cleaning recipe A1, the line cleaning time for the cleaning recipes A2, A3, and B2 may also be changed from the originally set time through the machine learning.

Unlike the cleaning recipe A1, the cleaning recipe B1 includes the pressurized purge as the last cleaning operation, but the machine learning may also be performed substantially in the same manner as that in the cleaning recipe A1 to change the number of times of the discharge operation of the pump 23 performed in the pressurized purge from the preset number of times. Focusing on the differences from the learning and the output of the cleaning recipe A1, in the learning stage, when the cleaning recipe B1 is executed as a result of the stay test and the pressurized purge of step T12 is performed, a detection signal is acquired each time the discharge operation of the pump 23 is performed. Thus, in the learning stage, detection signals are acquired as many as the preset number of discharge operation times. Then, the detection signals at the discharge operation time of each pump in the last pressurized purge of the cleaning recipe B1 performed once or multiple times are stored in the memory 44 in association with the number of repetition times of the cleaning recipe B1 and the graph for the discharge amount vs. the number of particles. Then, the control unit 4 identifies the number of discharge times indicating how many discharge operations are performed until the number of particles no longer exceeds the reference value, during the last pressurized purge (referred to as the number of convergence times).

As the output, when the stay test is performed so that the graph for the discharge amount vs. the number of particles, which presents the cleaning recipe A1, is obtained, the graph with the highest similarity of the waveform is identified from the graphs obtained in the past by executing the cleaning recipe B1. The cleaning recipe B1 is repeated as many times as the number of repetition times corresponding to the graph, the discharge operation in the pressurized purge of the last cleaning recipe B1 among the repeated cleaning recipes B1 is performed as many times as the number of convergence times, and step T13 is performed while the discharge operation is performed as many times as the number of convergence times, to determine whether the apparatus has been restored. That is, the number of discharge operation times in the last cleaning recipe B1 is less than the preset number of times.

With the machine learning and the output described above, it is possible to avoid that the pressurized purge is unnecessarily performed even when the flow path 20 may not be sufficiently cleaned due to an unforeseen factor. Further, in the cleaning recipe B1 as well, the present disclosure is not limited to identically applying the number of convergence times obtained in the learning stage to the output stage, but for example, the number of convergence times may be changed according to the similarity of the graph, as in the cleaning recipe A1.

As described above, parameters, which affect the cleaning of the flow path 20 in the cleaning operation, such as the flow time of the cleaning liquid and the number of times of the discharge operation by the pump 23, are appropriately set by the machine learning. This indicates that the appropriate timing for stopping the cleaning operation is predetermined.

Another modification will be described. In the present modification, the selection of a cleaning recipe is performed after the performance of the stay test, by the machine learning. First, the stay test is performed as in each embodiment described above, to acquire the graph for the discharge amount vs. the number of particles. The operator sets and executes an arbitrary cleaning recipe. In the last cleaning operation included in the cleaning recipe, the number of particles is determined as in the embodiment described above. When it is determined that the number of particles is equal to or less than the reference value, the graph for the discharge amount vs. the number of particles is stored in the memory 44 in association with the contents of the executed cleaning recipe. This is repeated as a learning process. That is, an effective cleaning recipe for the waveform of the graph is repeatedly learned.

As an output of the learning, when the graph for the discharge amount vs. the number of particles is acquired by the stay test, a graph with the highest similarity with the waveform of the graph is identified among the waveforms acquired until that time. Then, the cleaning recipe corresponding to the identified graph is presented to the user or executed. Thus, in the present example, multiple candidate cleaning recipes are stored in the memory 44, and when the stay test is performed, the most effective cleaning recipe for cleaning the flow path 20 is selected from the candidates to be presented or executed, according to the result of the stay test.

When the stay test is performed to acquire the graph for the discharge amount vs. the number of particles, for example, the operator separates each member of the flow path 20 from the piping system 2, and individually conducts an arbitrary test to identify a contaminated location. A learning may be performed to store the identified contaminated location in the memory 44 in association with the graph. When the graph for the discharge amount vs. the number of particles is acquired as an output, a graph with the highest similarity among the graphs acquired in the learning stage is identified. A contaminated location corresponding to the identified graph may be presented to the user as an estimated contaminated location. Thus, in the present example, multiple candidates are stored in the memory 44 as contaminated locations, and when the stay test is performed, a candidate that is highly likely to be a contaminated location, among the candidates is selected from the candidates and presented according to the result of the stay test.

Meanwhile, the machine learning for estimating a contaminated location as described above may be a machine learning that constructs a neural network by accumulating the graph for the discharge amount vs. the number of particles acquired by the stay test and an identified contaminated location, in the memory 44. For example, the neural network is configured such that the number of particles is input to an input layer at predetermined intervals of the discharge amount, for the graph of discharge volume vs. number of particles obtained by the dwell test. Thus, nodes in the input layer are provided as many as the intervals. For example, three nodes are provided as nodes of the output layer, and these nodes output probabilities that the valve V1, the pump 23, and other members are contaminated locations. Specifically, when the graph for the discharge amount vs. the number of particles is obtained after the learning stage, probabilities may be displayed on the notification unit 42, such as 1% probability (Y) that the valve V1 is a contaminated location, 2% probability (Y) that the pump 23 is a contaminated location, and 3% probability (Y) that other components are contaminated locations.

Data may be similarly accumulated for the graph for the discharge amount vs. the number of particles and an effective cleaning recipe to construct a neural network, and 1% effectiveness (Z) of the cleaning recipe A1, 2% effectiveness (Z) of the cleaning recipe A2, . . . may be displayed from the output layer of the network. Further, when information corresponding to ranking of the contaminated locations or the cleaning recipes (probabilities of contaminated locations and probabilities of effectiveness in the example above) is provided as described above, this case indicates that the estimation of a contaminated location or the presentation of a cleaning recipe has already been performed. When the effectiveness of a cleaning recipe is already calculated, a cleaning recipe with the highest effectiveness may be automatically executed.

When the control unit 4 detects the discharge amount of thinner or resist from the nozzle 21, the operation is not limited to monitoring the operation of the pump 23, but may be performed based on a detection signal from a flowmeter provided in the piping system 22. Thus, the discharge of the liquid staying during the stay test may be performed by the supply of the $N_2$ gas from the $N_2$ gas supply source 27 to the resist storage unit 25 or the thinner storage unit 28. In performing the discharge of the liquid, in the example described above, the liquid is discharged from the nozzle 21, but the present disclosure is not limited to discharging the liquid from the nozzle 21. A discharge path may be provided on the downstream side of the flow path 20 to branch from the flow path 20, and the thinner or resist may be discharged through the discharge path by opening and closing a valve appropriately provided in the flow path 20 and the discharge path, so that the flow though the flow path 20 may be performed.

Further, the light receiving unit 33 of the foreign substance detection mechanism 3 is not limited to receiving the side scattering light, but may receive, for example, a forward scattering light. The light received by the light receiving unit 33 from the flow path is not limited to the scattering light, but may receive transmitted light in the light transmitting unit 31.

The processing liquid supplied to process the substrate is not limited to the resist. For example, before the resist is supplied, the thinner is applied to the wafer W as a processing liquid, to modify the surface. The stay test may be performed, and a cleaning recipe may be presented and executed for the flow path of the thinner. Other processing liquids may be, for example, a developing liquid, a cleaning liquid for cleaning the wafer W, a chemical liquid for forming an antireflection film, a chemical liquid for forming an insulating film, and an adhesive for bonding wafers W together. The processing target substrate is not limited to a circular wafer W, but may be a square substrate useful for the purpose of manufacturing, for example, a flat panel display.

The embodiments disclosed herein are examples, and should not be construed as being limited in all aspects. Various omissions, substitutions, changes, and combinations may be made to the foregoing embodiments without departing from the scope and the gist of appended claims.

LIST OF REFERENCE NUMERALS

W wafer
1 resist coating apparatus
21 nozzle
22 pipe
28 resist storage unit
32 light projecting unit
33 light receiving unit

What is claimed is:

1. A liquid processing method comprising:
flowing a processing liquid through a flow path connecting a reservoir storing the processing liquid and a processing liquid supply, and discharging the processing liquid to a substrate from the processing liquid supply, thereby processing the substrate;
filling the flow path with a liquid and keeping the liquid stay in the flow path;
flowing the liquid kept in the flow path through the flow path;
irradiating the flow path with a light by a light irradiator and receiving the light from the flow path by the light receiver, during the flowing the liquid, to acquire a detection signal output from the light receiver according to a foreign substance in the liquid; and
responding to an abnormality in the flow path by estimating an abnormal location in the flow path based on the detection signal, and presenting or executing a response operation.

2. The liquid processing method according to claim 1, wherein in the filing, a time for keeping the liquid stay in the flow path is 0.5 hours or longer.

3. The liquid processing method according to claim 1, further comprising:
detecting a discharge amount of the liquid discharged from the processing liquid supply during the flowing the liquid,
wherein the responding is performed based on the discharge amount when a foreign substance is detected.

4. The liquid processing method according to claim 1, wherein the responding is performed based on a machine learning performed until the responding is performed, and the detection signal.

5. The liquid processing method according to claim 4, wherein
the responding includes a cleaning operation to flow a cleaning liquid through the flow path, and
the machine learning is a learning to determine a timing for terminating the cleaning operation.

6. The liquid processing method according to claim 4, wherein the responding includes a cleaning operation to flow a cleaning liquid through the flow path,
the response operation is selected from a plurality of response operation candidates, and
the machine learning is a learning to select the response operation.

7. The liquid processing method according to claim 1, wherein the responding includes:
estimating the abnormal location in the flow path based on the detection signal and the discharge amount of the liquid discharged from the processing liquid supply, and
presenting or executing the response operation responding to a result of the estimating.

8. A liquid processing apparatus comprising:
a processing liquid supply configured to discharge a processing liquid to a substrate, thereby processing the substrate;
a flow path connecting a reservoir that stores the processing liquid and the processing liquid supply;
a flow-through mechanism including a pump configured to flow a liquid through the flow path;
a light irradiator configured to irradiate the flow path with a light;
a light receiver configured to receive a light from the flow path; and a controller configured to perform a process including:

flowing the processing liquid through the flow path and discharging the processing liquid to the substrate from the processing liquid supply, thereby processing the substrate, filling the flow path with a liquid and keeping the liquid stay in the flow path, flowing the liquid kept in the flow path through the flow path, irradiating the flow path with a light by a light irradiator and receiving the light from the flow path by the light receiver, during the flowing the liquid, to acquire a detection signal output from the light receiver according to a foreign substance in the liquid, and responding to an abnormality in the flow path by estimating an abnormal location in the flow path based on the detection signal, and presenting or executing a response operation.

9. The liquid processing apparatus according to claim 8, wherein a timing for keeping the liquid stay in the flow path during the filling is 0.5 hours or longer.

10. The liquid processing apparatus according to claim 8, further comprising:

a measurement gauge configured to measure a discharge amount of the liquid discharged from the processing liquid supply during the flowing the liquid, wherein the responding is performed based on the discharge amount when a foreign substance is detected.

11. The liquid processing apparatus according to claim 8, wherein the responding is performed based on a machine learning performed until the responding is performed, and the detection signal.

12. The liquid processing apparatus according to claim 11, wherein the responding includes a cleaning operation to flow a cleaning liquid through the flow path, and the machine learning is a learning to determine a timing for terminating the cleaning operation.

13. The liquid processing apparatus according to claim 11, wherein the responding includes a cleaning operation to flow a cleaning liquid through the flow path, the response operation is selected from a plurality of response operation candidates, and the machine learning is a learning to select the response operation.

14. The liquid processing apparatus according to claim 8, wherein the responding includes:

estimating the abnormal location in the flow path based on the detection signal and the discharge amount of the liquid discharged from the processing liquid supply in the flowing the liquid, and presenting or executing the response operation to respond to a result of the estimating.

15. A non-transitory computer-readable storage medium having stored therein a program used in a liquid processing apparatus including:

a processing liquid supply configured to discharge a processing liquid to a substrate, thereby processing the substrate;

a flow path connecting a reservoir that stores the processing liquid and the processing liquid supply;

a flow-through mechanism including a pump configured to flow a liquid through the flow path;

a light irradiator configured to irradiate the flow path with a light; and a light receiver configured to receive a light from the flow path, the program causes the liquid processing apparatus to perform a process including:

flowing the processing liquid through the flow path and discharging the processing liquid to the substrate from the processing liquid supply, thereby processing the substrate, filling the flow path with a liquid and keeping the liquid stay in the flow path, flowing the liquid kept in the flow path through the flow path, irradiating the flow path with a light by a light irradiator and receiving the light from the flow path by the light receiver, during the flowing, to acquire a detection signal output from the light receiver according to a foreign substance in the liquid, and responding to an abnormality in the flow path by estimating an abnormal location in the flow path based on the detection signal, and presenting or executing a response operation.

* * * * *